United States Patent
Yamasaki et al.

[11] Patent Number: 6,139,904
[45] Date of Patent: Oct. 31, 2000

[54] METHOD OF MAKING A PRINTED BOARD

[75] Inventors: Kozo Yamasaki, Gifu; Osamu Hisada; Katsuhiko Hasegawa, both of Aichi; Naoki Kito, Nagoya; Satoshi Hirano; Yutaro Kameyama, both of Aichi, all of Japan

[73] Assignee: NGK Spark Plug Co., Ltd., Aichi, Japan

[21] Appl. No.: 09/422,119

[22] Filed: Oct. 20, 1999

[30] Foreign Application Priority Data

Oct. 20, 1998 [JP] Japan .................................. 10-298333

[51] Int. Cl.$^7$ ...................................... B05D 5/12
[52] U.S. Cl. .................... 427/97; 427/282; 427/383.1; 427/385.5; 101/129
[58] Field of Search ............... 427/97, 282, 385.5, 427/383.1; 101/129

[56] References Cited

U.S. PATENT DOCUMENTS

| | | | |
|---|---|---|---|
| 4,323,593 | 4/1982 | Tsunashima | 427/97 |
| 4,964,948 | 10/1990 | Reed | 427/97 |
| 5,191,709 | 3/1993 | Kawakami et al. | 427/97 |
| 5,268,194 | 12/1993 | Kawakami et al. | 427/97 |
| 5,822,856 | 10/1998 | Bhatt et al. | 427/97 |

FOREIGN PATENT DOCUMENTS

| | | | |
|---|---|---|---|
| 5-129781 | 5/1993 | Japan | H05K 3/46 |
| 5-175650 | 7/1993 | Japan | H05K 3/40 |
| 9-321431 | 12/1997 | Japan | H05K 3/46 |
| 9-321434 | 12/1997 | Japan | H05K 3/46 |

*Primary Examiner*—Brian K. Talbot
*Attorney, Agent, or Firm*—Sughrue, Mion, Zinn, Macpeak & Seas, PLLC

[57] ABSTRACT

A method of making a printed board is provided. The printed board has a base provided with a plurality of through via conductors having through holes extending completely between upper and lower surfaces of the base and closed by resin fillings and a plurality of blind via conductors having depressions closed by resin fillings. The method comprises the steps of preparing the base provided with the through via conductors having the through holes and the blind via conductors having the depressions, filling the through holes of the through via conductors and the depressions of the blind via conductors with resin paste by printing, while at the same time forming, on an upper surface of the base and at locations around the through holes of the through via conductors and the depressions of the blind via conductors, a plurality of projections made of the above described resin paste by printing, and curing the resin paste, thereby forming the resin fillings in the through holes of the through via conductors and the depressions of the blind via conductors. By this method, the upper surfaces of the resin fillings in the through holes and the depressions are not caused to recede or sink and become lower in level than the upper surface of the base but can be maintained higher in level than the upper surface of the base, thus making it possible to dispense with a manufacturing step for closing receding spaces and manufacture the printed board at lower cost.

23 Claims, 7 Drawing Sheets

METHOD OF MAKING A PRINTED BOARD

BACKGROUND OF THE INVENTION

1. Field of the Invention

The present invention relates to a method of making a printed board having a base having hollow portions closed by resin fillings. Further, the present invention relates to a method of making a printed board having a base having through via conductors having through holes and blind via conductors having depressions, which through holes and depressions are closed by resin fillings. Further, the present invention relates to a method of making a printed board which is capable of preventing, after curing of resin paste filled in the hollow portions as through holes and depressions, the surfaces of cured resin fillings from receding or sinking and becoming lower in level than the surface of the base.

2. Description of the Related Art

Heretofore, in order to connect between conductive layers formed on upper and lower surfaces of a printed board or conductive layers formed inside the printed board, it has generally been practiced to provide the printed board with through via conductors and blind via conductors for connecting between the conductive layers. In manufacture of such a printed board, the through holes of the through via conductors and the depressions of the blind via conductors are closed by resin fillings so that an insulating resin layer placed on a layer having such via conductors can be flat or planar.

Figure 9A:
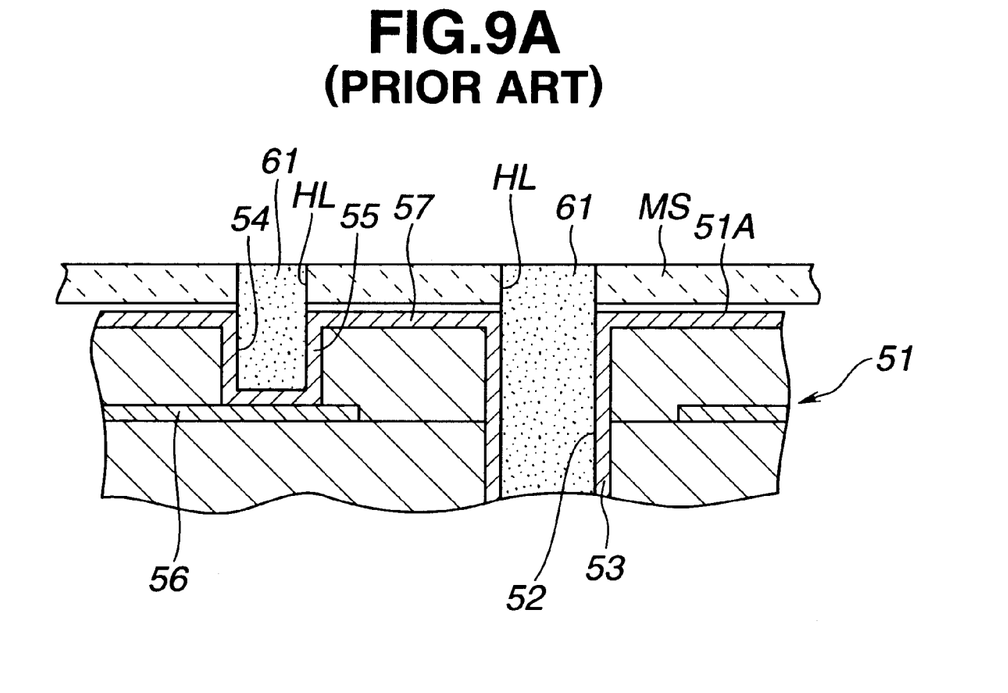

In this connection, a prior art process of closing the through holes of the through via conductors and the depressions of the blind via conductors by resin fillings is by way of example shown in FIGS. 9A–9B and 10A–10B. As shown in FIG. 9A, it is prepared a base 51 which is provided with through via conductors 53 extending completely between an upper surface 51A and a lower surface (not shown) of the base 51 and having through holes 52 therewithin, blind via conductors 55 disposed on the upper surface 51A and having depressions 54, and internal conductors 56 disposed inside the base 51. The surface 51A of the base 51 prior to being formed with a conductive layer is entirely covered by and therefore defined by a metallic layer 57. On the surface 51A is placed a mask MS having through holes HL corresponding in position and shape to the through holes 52 and the depressions 54, and then printing is performed for filling, by way of the mask MS, the through holes 52 and the depressions 54 with resin paste 61.

Thereafter, the base 51 is heated to cure the resin paste fillings 61 for thereby forming cured resin fillings 62 in the through holes 52 and the depressions 54.

Figure 9B:
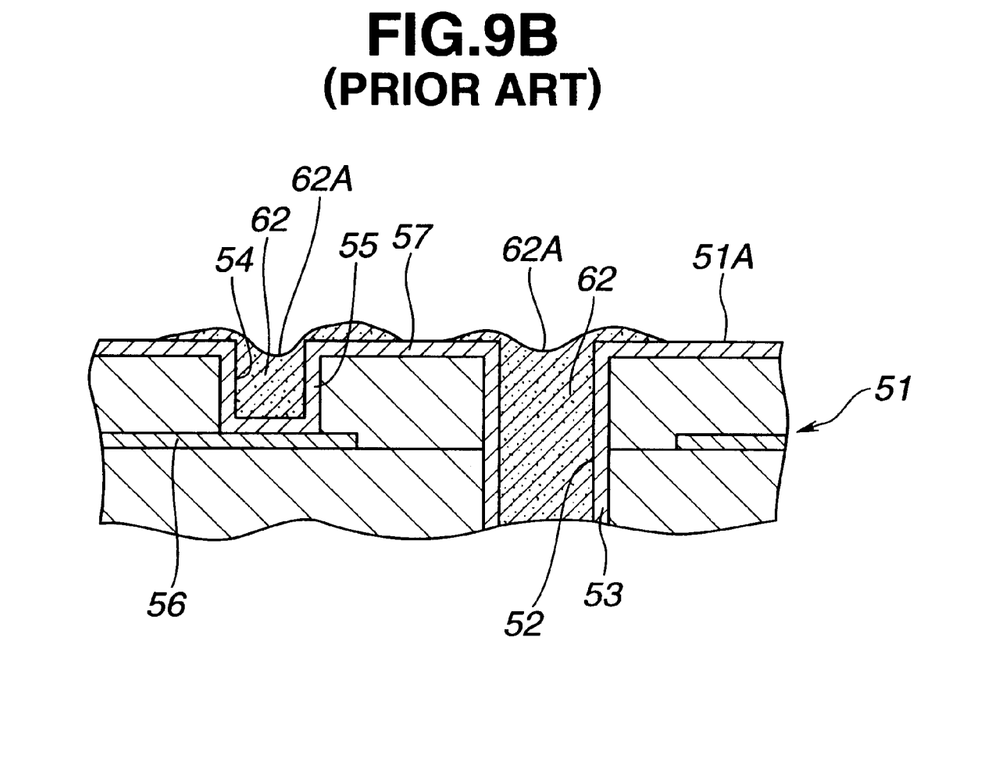

As shown in FIG. 9B, after curing, the surfaces of the resin fillings 62 in the through holes 52 and the depressions 54 are caused to recede or sink and become lower in level than the surface 51A of the base 51. Such receding is caused because a portion of each resin paste filling 61, protruding from the surface 51A of the base 51, is heated to melt and spread over the surface 51A of the base 51, thus causing the resin paste fillings 61 within the through holes 52 and the depressions 54 to decrease and lack in quantity, that is, a so-called bleed-out is caused. If such resin paste fillings 61 are cured, the surfaces of the cured resin fillings 62 are caused to recede to form receding spaces thereon. Further, it is considered that in case contraction is caused by curing, such receding or sinking is accelerated by the contraction.

Figure 10A:
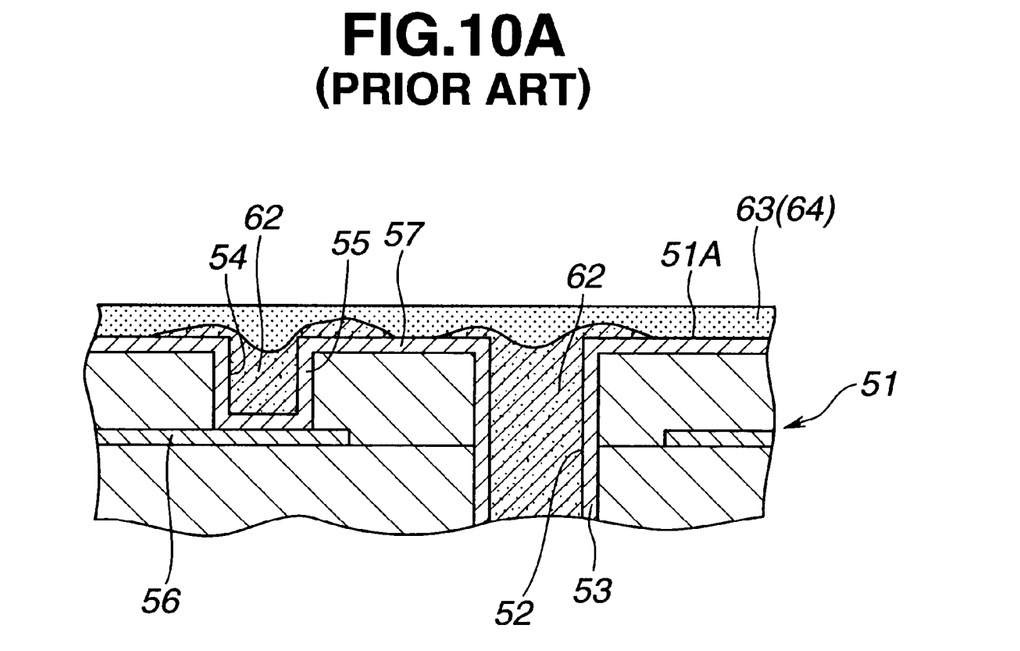
Figure 10B:
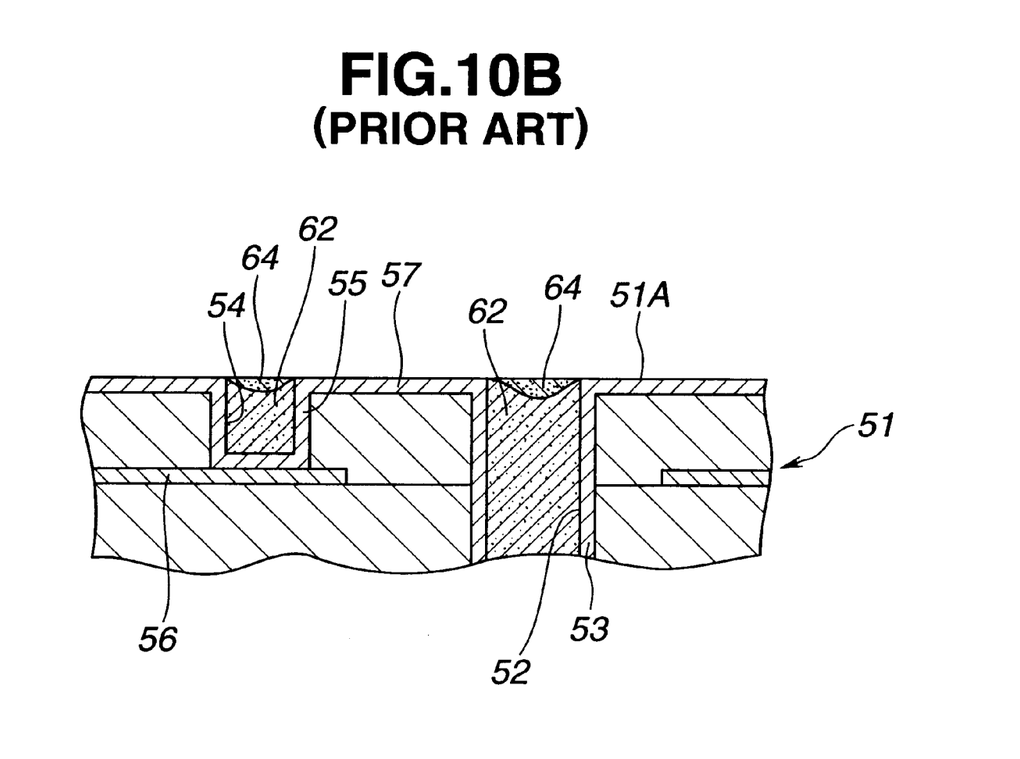

Due to this, in order to close the spaces receding beyond the surface 51A of the base 51, the following process is necessitated. That is, resin paste 63 is additionally applied to the entire surface 51A of the base 51 as shown in FIG. 10A. Then, the base 51 is heated again to cure the additionally applied resin paste 63 to form cured resin 64. Thereafter, the layer of cured resin 62 and 64 on the surface 51A of the base 51 is ground in such a manner that the surface 51A of the base 51 is flush with the surfaces of the fillings made up of the cured resin 62 and 64.

That is, in order to close the through holes 52 and the depressions 54 of the base 51, the above described process requires to carry out application of resin paste 61 and 63 by printing twice and accordingly to carry out a curing step twice, thus increasing the number of manufacturing steps and making higher the cost of the printed board.

SUMMARY OF THE INVENTION

It is therefore an object of the present invention to provide a method of making a printed board, which can solve the above noted problem inherent in the prior art method.

It is another object of the present invention to provide a method of making a circuit board, which is of the foregoing character and which can close hollow portions as through holes and depressions without causing such sinking and receding of the surfaces of resin fillings, thus making it possible to dispense with some manufacturing steps otherwise necessitated and therefore manufacture the printed board with efficiency and at lower cost.

To achieve the foregoing objects, the present invention provides a method of making a printed board having a base provided with a plurality of through via conductors having through holes extending completely between upper and lower surfaces of the base and closed by resin fillings and/or a plurality of blind via conductors having depressions closed by resin fillings, the method comprising the steps of preparing the base provided with the through via conductors having the through holes and/or the blind via conductors having the depressions, filling the through holes of the through via conductors and/or the depressions of the blind via conductors with resin paste by printing, while at the same time forming, on an upper surface of the base and at locations around the through holes of the through via conductors and/or the depressions of the blind via conductors, a plurality of projections made of the above described resin paste by printing, and curing the resin paste, thereby forming the above described resin fillings.

According to the present invention, at the filling step, not only the resin paste is filled in the through holes of the through via conductors and/or the depressions of the blind via conductors by printing but a plurality of projections of resin paste are formed by printing on the surface of the base and at locations around the through holes and the depressions. Due to this, when the resin paste is heated and cured after the filling step, the surfaces of the cured resin fillings in the through holes and the depressions are not caused to sink or recede so as become lower in level than the upper surface of the base.

It is considered that the receding spaces on the surfaces of the cured resin fillings in such through holes and depressions are caused mainly due to bleed-out as described above and in addition contraction at curing assists to form such receding spaces. However, according to the present invention, the projections of resin paste are formed on the surface of the base and at locations around the through holes and/or depressions previously, so the resin paste projections are caused to melt and spread over the surface of the base at the time of heating. As a result, the area over which the resin paste fillings in the through holes and/or the depressions are caused to spread when heated to melt, becomes narrower or smaller, resulting in that the amount of resin flowing away from the through holes and/or depressions becomes smaller. Due to this, even after the resin paste fillings are cured and caused to contract, it never occurs that the surfaces of the cured resin fillings in the through holes and/or depressions are receded to become lower in level than the surface of the base.

Accordingly, it becomes unnecessary to apply resin paste again and heat and cure the applied resin paste again, which is otherwise necessitated in the prior art method in order to close the receding spaces which are formed on the surfaces of the once applied and cured resin fillings and which are lower in level than the surface of the base. Due to this, each of the filling step and the curing step can be reduced by one time, thus making it possible to manufacture the printed board at lower cost.

In this connection, the base can be made up of a single insulating layer or a plurality of insulating layers which are laminated one upon another. Further, the surface of the base can be covered by a metal layer in its entirety or can be formed with conductive layers of a predetermined pattern previously. Particularly, it is desirable to apply the present invention to a base of the kind having an upper surface which is entirely covered by a metal layer since the resin paste is liable to spread over the metal layer.

The through via conductors can be formed by, for example, forming through holes in the base by drilling or laser cutting and then plating the inner peripheral surfaces of the through holes.

Further, the blind via conductors can be formed by, for example, forming blind holes or bottomed holes on the surface of the base by the photolithography or laser cutting and plating the inner peripheral surfaces of the blind holes in such a manner as to form depressions.

It is desirable to perform the filling step, by preparing a mask having a plurality of through holes for filling the through holes and the depressions with resin paste and for forming projections of resin paste, then placing the mask on the base and filling resin paste by printing. By using such a mask, filling of resin paste into the through holes and depressions can be attained with ease and the projections of resin paste can be formed with ease.

The resin paste can be of any kind so long as it can fill the through holes and depressions, but it is preferable that the coefficient of thermal expansion of the resin paste is nearly equal to that of the base since the thermal stress can be reduced. Further, in order to prevent the surfaces of the resin fillings in the through holes and the depressions from receding and becoming lower in level than the surface of the base at the curing step as mentioned above, the resin paste of the kind which contracts a little by heat-curing, for example, a material for the resin paste can be selected suitably from epoxy resin, polyimide resin and BT resin. Further, the resin paste can be formed by applying inorganic powder such as silica and alumina to selected one of the above described resins. Further, the resin paste can contain conductive powder such as Cu powder and Ag powder to have conductivity.

After the curing step, the surface of the base, consisting of the cured resin, is ground in such a manner that the surfaces of the cured resin fillings in the through holes and the depressions are flush with the surface of the base. Thereafter, a plurality of layers are formed on the base according to the necessity, for example, an insulating layer is placed upon the base, and then a conductive layer of a predetermined pattern is formed on the insulating layer, whereby to manufacture a printed board.

In the meantime, in case a base whose upper surface is entirely covered by a metal layer is used, the above described grinding is carried out after the curing step and thereafter the metal layer is processed by etching to form a conductive layer of a predetermined pattern on the surface of the base. In case a conductive layer of a predetermined pattern is formed on the surface of the base previously, the above described grinding is performed after the filling step and the curing step, whereby to make ready for a next step of laminating of an insulating layer.

In this connection, the printing area for printing the projections of resin paste can be formed into various shapes, for example, a circular shape, elliptic shape and polygonal shape but it is preferably formed into a circular shape since the mask can be removed with ease. In this case, the projections of resin paste preferably range in diameter from 100 to 500 $\mu$m.

The projections of resin paste are formed by, for example, preparing a mask having at predetermined positions thereof through holes which are determined on consideration of the shape, size, etc. of the projections, placing the mask upon the base and applying paste onto the mask to carrying out printing. In this instance, when the printing area for printing the projections of resin paste is too large, the mask cannot be separated or removed from the base with ease. If the mask cannot be removed from the base with ease, continuing production of the base cannot be attained, thus lowering the production efficiency and the yielding rate due to defective printing.

In contrast to this, if the diameter of the projections of resin paste is determined so as to be 500 $\mu$m or less, more preferably 300 $\mu$m or less, the mask can be removed with ease after printing of the projections. Accordingly, continuing production of the base can be attained and therefore the yielding rate can be improved. Further, the diameter of the projections of resin paste are determined so as to be 100 $\mu$m or more for the reason that if the diameter is less than 100 $\mu$m the projections is too small in the quantity of resin paste and cannot spread so widely over the surface of the base when heated to melt. Thus, the projections of resin paste cannot produce a sufficient effect of preventing the surfaces of the cured resin fillings in the through holes and the depressions from receding so as to become lower in level than the surface of the base.

In the above described method of this invention, the projections of resin paste are preferably arranged in such a manner that there exists within the distance of 1 mm or less from one of the through holes and depressions, at least one of the remainder of the through holes, the remainder of the depressions and the projections.

By disposing the projections of resin paste around the though holes of the through via conductors and the depressions of the blind via conductors in the above described manner, it becomes possible to prevent the surfaces of the cured resin fillings in the through holes and the depressions from sinking or receding to form receding or depressed spaces. However, when the distance between adjacent two of the through holes, the depressions and the projections of resin paste increases, molten resin resulting from the resin paste fillings in the through holes and the depressions is caused to spread over a wider area on the surface of the base, so the surfaces of the cured resin fillings in the through holes and the depressions are liable to sink or recede to form receding or depressed spaces thereon.

According to the present invention, within the distance of 1 mm or less from one of the through holes or the depressions, another of the through holes or the depressions or one of the projections of resin paste is arranged. Due to this, the resin paste filling in another of the through holes or the depressions or one of the projections of resin paste is caused to melt and spread over the surface of the base, so the resin paste filling in one of the through holes or depressions is caused to spread over a narrower area when heated to melt. Accordingly, the cured resin filling in one of the through holes does not decrease in the quantity so much, thus making it possible to prevent the surfaces of the resin fillings from sinking or receding so as to become lower in level than the surface of the base after curing assuredly.

In this connection, it is desirable to dispose the projections of resin paste in such a manner that within the distance of 1 mm or less from one of the through holes or depressions there exist another of the through holes and/or another of the depressions and/or one of or some of the projections of resin paste in a way as to surround the above described one of the through holes or depressions. By such an arrangement, the surfaces of the cured resin fillings in the through holes and the depressions can be prevented from receding or sinking and becoming lower in level than the surface of the base more assuredly.

Further, it is preferable to arrange the projections of resin paste in such a manner that the above described distance is 0.7 mm or less. By making the distance smaller, the surfaces of the cured resin fillings in the through holes and the depressions can be prevented from receding or sinking and becoming lower in level than the surface of the base further assuredly.

In the above described method of this invention, it is preferable that a larger number of the projections of resin paste are arranged in a region of the upper surface of the base where the distance of adjacent two of the through holes and the depressions is larger. In the region where the through holes and the depressions are closely disposed, i.e., the distance between adjacent two of them is small, the resin paste fillings in the through holes and the depressions spread over only a narrow area when heated to melt but the entire surface of region can be covered by molten resin. Thus, in such a region, none of the projections of resin paste is disposed or only a small number of the projections of resin past are disposed. Even by this, the cured resin fillings in the through holes and the depressions do not decrease in quantity so much and therefore the surface of the fillings do not recede or sink and become lower in level than the surface of the base.

On the other hand, in the region where the through holes and the depressions are coarsely disposed, i.e., the distance between adjacent two of then is large, the resin paste fillings in the through holes and the depressions spread over a wide area when heated to melt, thus causing the resin fillings in the through holes and the depressions to decrease in quantity and thereby causing the surfaces of the resin fillings to be liable to recede or sink and become lower in level than the surface of the base. In this embodiment, in the region where the distance between adjacent two of the through holes and the depressions is larger, a larger number of the projections of resin paste are arranged. Thus, the projections of resin paste caused to spread when heated to melt, causes the resin paste fillings in the through holes and the depressions to spread over a relatively small area. As a result, the resin paste fillings in the through holes and the depressions do not decrease in quantity so much, thus not causing the surfaces of the cured resin fillings in the through holes and the depressions to recede or sink and become lower in level than the surface of the base.

BRIEF DESCRIPTION OF THE DRAWINGS

FIGS. 9A and 9B are fragmentary sectional views of a base of a printed circuit board for illustrating steps of a prior art method of making a printed board, wherein FIG. 9A shows a step of mounting a mask on the base and filling through holes and depressions with resin paste and FIG. 9B shows the base after a curing step; and FIGS. 10A and 10B are fragmentary sectional views of the base of FIGS. 9A and 9B for illustrating further steps of the prior art method of FIGS. 9A and 9B, wherein FIG. 10A shows a step of applying resin paste to the base again and FIG. 10B shows a step of grinding a layer of cured resin on the surface of the base.

DETAILED DESCRIPTION OF THE PREFERRED EMBODIMENTS

Figure 1A:
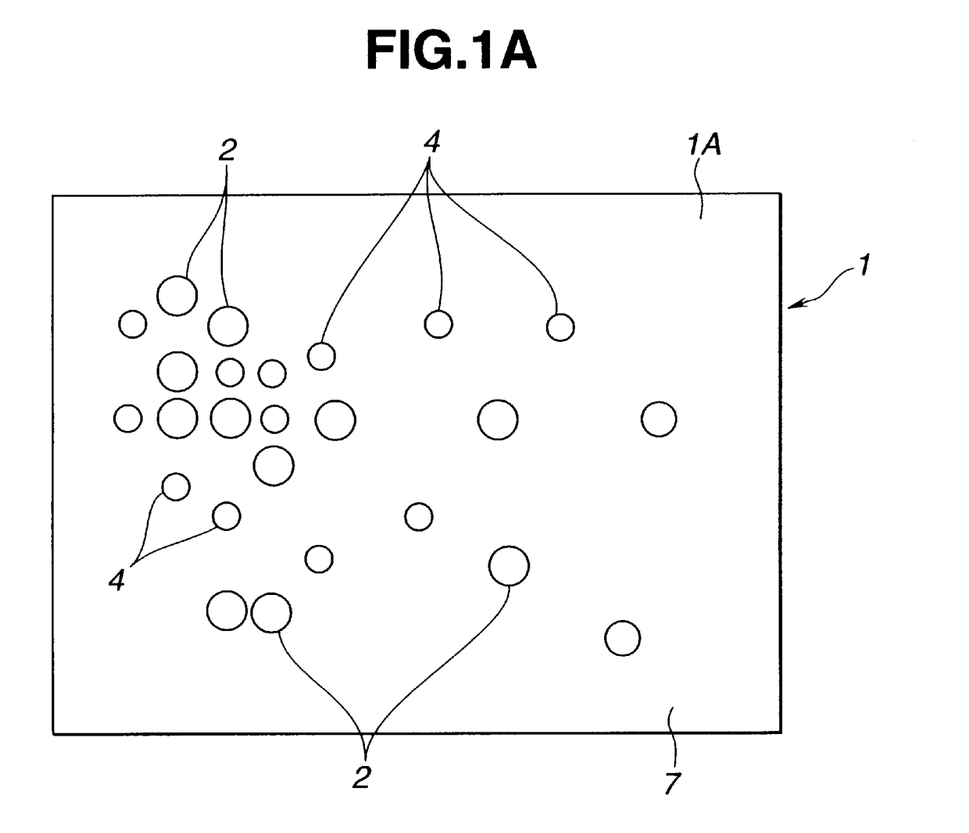
FIG. 1A is a top plan view of a base of a printed board, prior to a filling step, which step constitutes part of a method of making a printed board according to a first embodiment of the present invention.
Figure 1B:
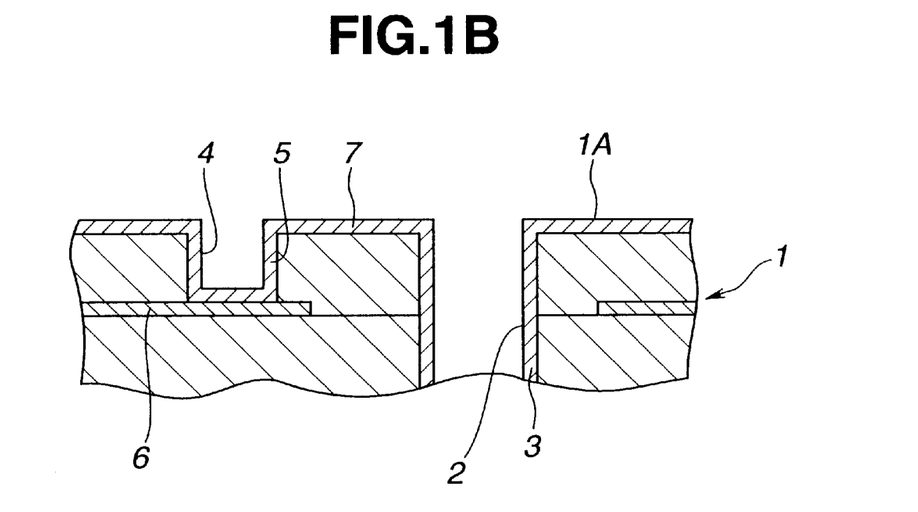
FIG. 1B is an enlarged, fragmentary sectional view of the base of FIG. 1A.
Figure 4:
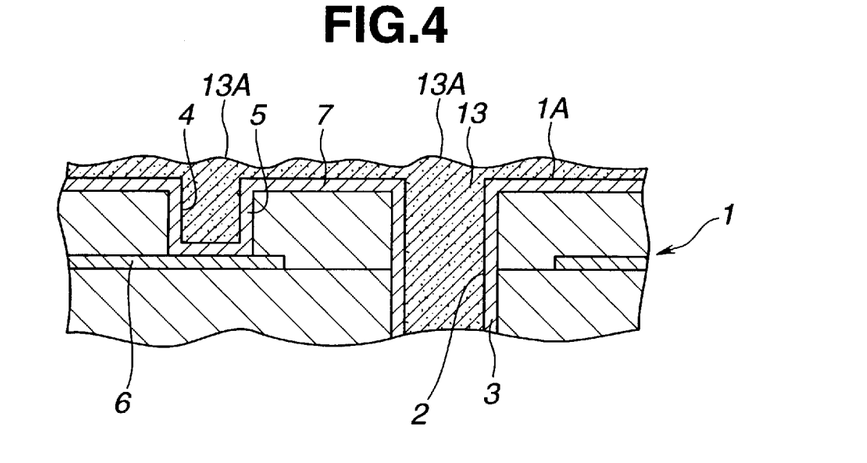
FIG. 4 is an enlarged, fragmentary sectional view of the base of FIG. 1A after a curing step according to the first embodiment.
Figure 5:
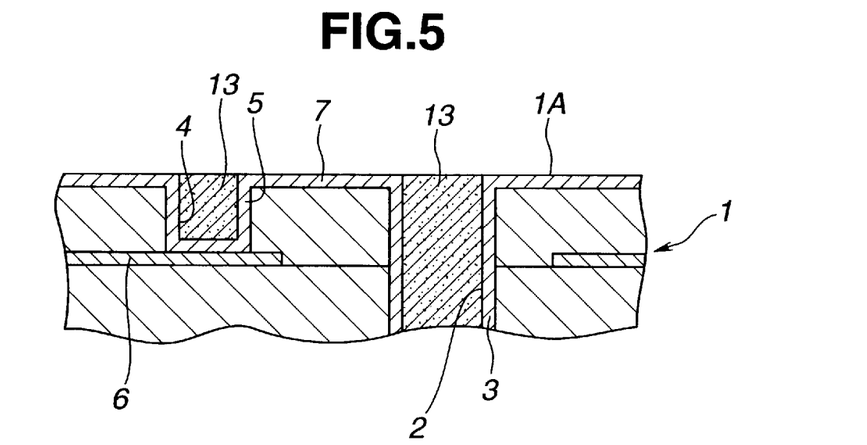
FIG. 5 is a view similar to FIG. 4 but shows the base after a grinding step.

Referring first to FIGS. 1A–1B to 5 inclusive, a first embodiment will be described.

A base for printed board is generally indicated by 1 and nearly rectangular when view in a plan view as seen from FIG. 1A and in the form of a plate. The base 1 is provided with a plurality of through via conductors 3 which extend completely between an upper surface 1A and a lower surface (not shown) thereof and blind via conductors 5 disposed on the surface 1A. Further, the through via conductors 3 have through holes 2 of 300 $\mu$m in diameter. The blind via conductors 5 have depressions 4 of 80 to 100 $\mu$m in diameter. These via conductors 3 and 5 are formed by forming through holes and blind holes at predetermined positions in the base 1 by laser cutting and plating the peripheral surfaces of the through holes and blind holes. By this plating process, the entire upper surface 1A of the base 1 is covered by a plated layer 7. Further, inside the base 1 are formed conductive layers 6 which are partially connected to the blind via conductors 5 and so on.

Figure 2:
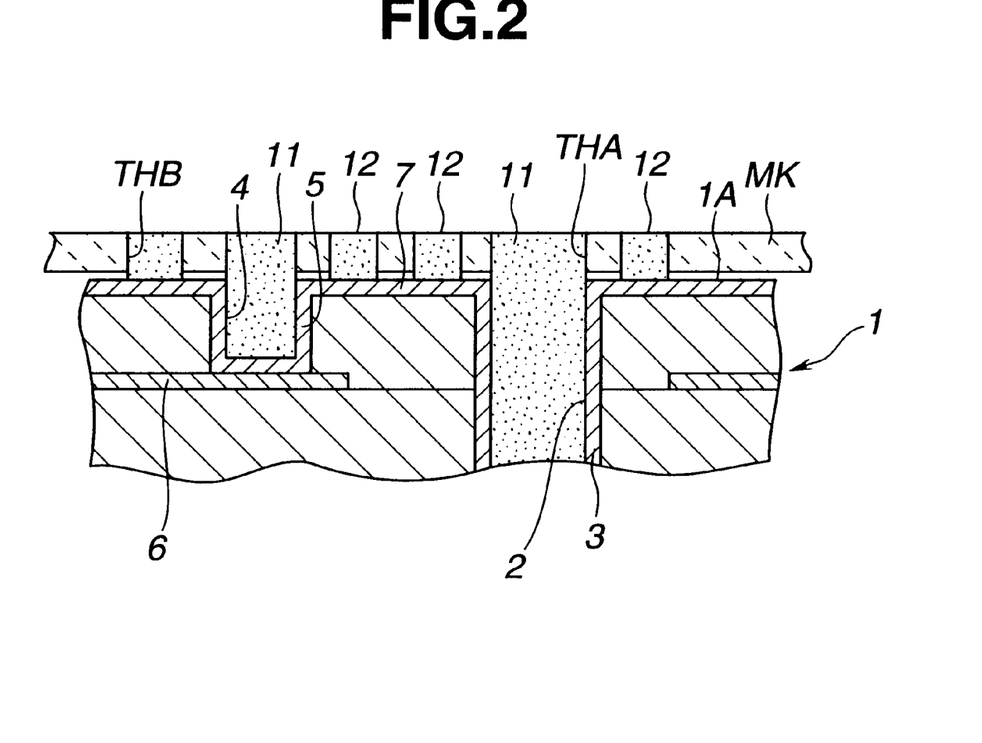
FIG. 2 is a view similar to FIG. 1B but shows the filing step according to the first embodiment.

A metal mask MK shown in FIG. 2 is prepared. The metal mask MK is made of stainless steel and 100 μm thick, and has through holes THA corresponding in position and shape to the through holes 2 and the depressions 4 for filling them with resin paste and through holes THB for forming wartlike projections 12 of resin paste. As shown in FIG. 2, at a filling step, the mask MK is placed upon the base 1 to print with resin paste 11. By this printing, the through holes 2 and the depressions 4 are filled with resin paste, i.e., closed by resin paste fillings 11, while at the same time a plurality of wartlike resin paste projections 12 are formed.

Figure 3A:
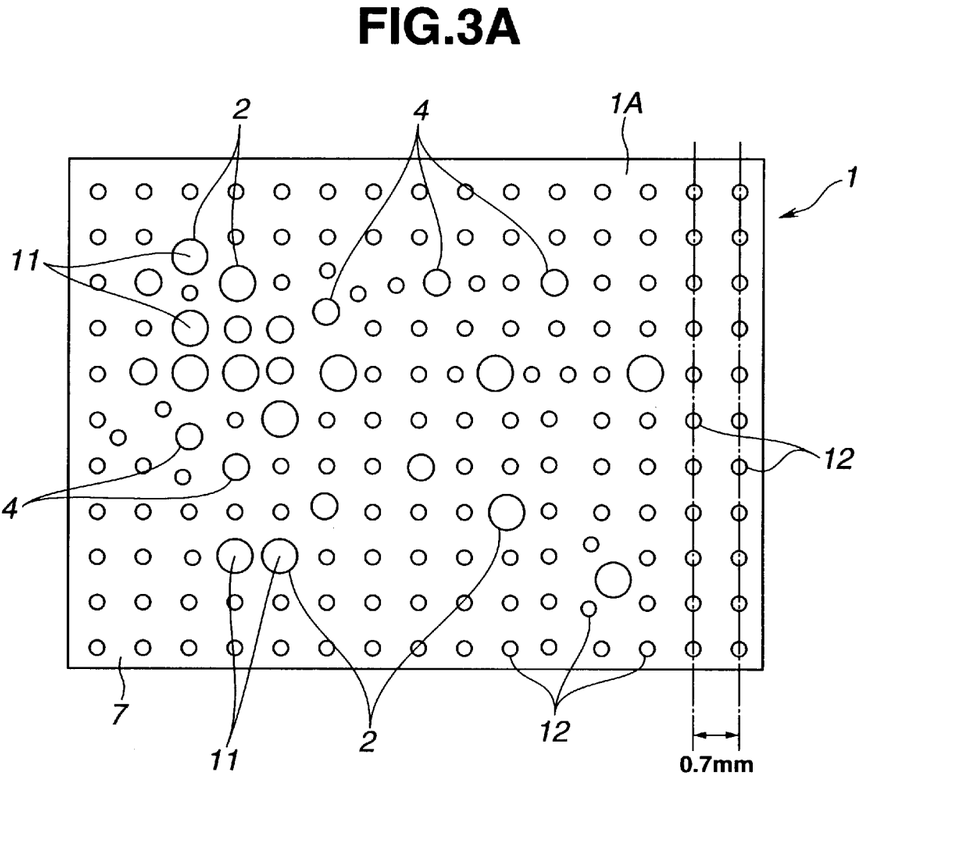
FIG. 3A is a top plan view of the base of FIG. 1A after the filling step according to the first embodiment.
Figure 3B:
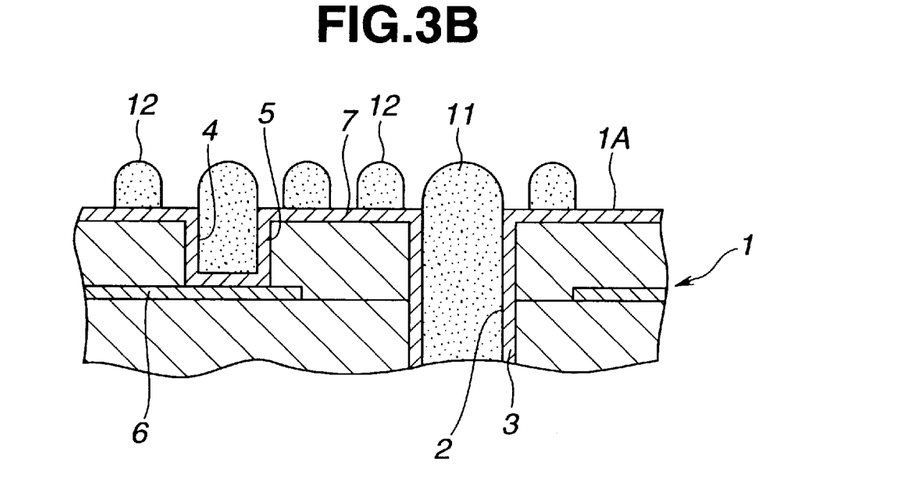
FIG. 3B is an enlarged, fragmentary sectional view of the base of FIG. 3A.

Thereafter, by removal of the metal mask MK, such a base 1 shown in FIGS. 3A and 3B is obtained. That is, in the base 1, the through holes 2 and the depressions 4 are closed by the resin paste fillings 11 in such a manner that each resin paste filling 11 partly protrudes from the surface 1A of the base 1. Further, on the surface 1A of the base 1 are formed a plurality of nearly semispherical, wartlike resin paste projections 12 which are printed by nearly circular printing areas ranging in diameter from 100 to 300 μm.

The wartlike resin paste projections 12 are not disposed or only some of them are disposed in the region where the distance between adjacent two of the through holes 2 and the depressions 4 is small, i.e., the though holes 2 and the depressions 4 are densely or closely arranged (for example, in the upper left region in FIG. 3A). On the other hand, in the region where the through holes 2 and the depressions 4 are not closely, i.e., coarsely arranged (for example, in the right lower region in FIG. 3A), a number of wartlike resin paste projections 12 are arranged so as to surround the through holes 2 and the depressions 4. Numerically, in case the distance between adjacent two of the through holes 2 and the depressions 4 is large and there does not exist, within the distance of 1 mm or less from one through hole 2 or one depression 4, another through hole 2 or another depression 4, the wartlike resin paste projections 12 are arranged adjacent to that one through hole 2 or depression 4.

In the meantime, in this embodiment, also in a surface 1A region where there does not exist any of the through holes 2 and depressions 4 (e.g., in the right-hand end portion in FIG. 3A), the wartlike resin paste projections 12 are arranged in a grid pattern adjacent two of which vertical or horizontal rows are about 0.7 mm distant from each other.

Then, at a curing step, the base 1 is heated at the temperature of 120° C. for 20 minutes to cure the resin paste fillings 11 in the through holes 2 and the depressions 4 and the wartlike resin paste projections 12. However, in this embodiment, the through holes 2, the depressions 4 and the wartlike resin paste projections 12 are arranged densely, i.e., arranged so that adjacent two of them are closely located, so the surface 1A of the base 1 is entirely covered by resin paste though the resin paste fillings 11 and 12 are spread only a little. As a result, the quantity of the resin paste fillings 11 in the through holes 2 and the depressions 4 does not reduce so much. That is, the resin paste fillings 11 in the through holes 2 and the depressions 4 are held in the state of protruding sufficiently from the surface 1A of the base 1. Accordingly, even after curing of the resin paste fillings 11 and the resin paste projections 12, the surface 13A of cured resin paste fillings 13 is held protruded from the surface 1A of the base 1.

Due to this, it becomes unnecessary to apply resin paste to the surface 1A of the base 1 once again, as is necessitated in the prior art method, for filling the receding spaces which are lower in level than the surface 1A of the base 1. Accordingly, as compared with the prior art method, each of the filling step and the curing step can be omitted by one time, thus making it possible to manufacture the printed board at lower cost.

After the curing step, as shown in FIG. 5, the cured resin 13 portion lying on the surface 1A of the base 1 is ground by a known technique in such a manner that the surface 1A of the base 1 is made flush with the surfaces of the cured resin fillings 13 filled in the through holes 2 and the depressions 3 and the entire surface of the metallic layer 7 is exposed.

Then, though now shown, the metallic layer 7 extending over the entire surface 1A of the base 1, is processed by a known technique such as etching to form a conductive layer of a predetermined pattern. Thereafter, though not shown, an insulating layer may be placed upon the base 1 and a conductive layer may be formed on the insulating layer according to the necessity, whereby to complete a printed board.

In the meantime, since the printing surface area on which the resin paste projection 12 is printed is nearly circular and 100 to 300 μm in diameter, the mask MK can be removed very easily after printing of the fillings and projections 11. This enables continuous production of a printed board and makes the yielding rate higher.

Figure 6:
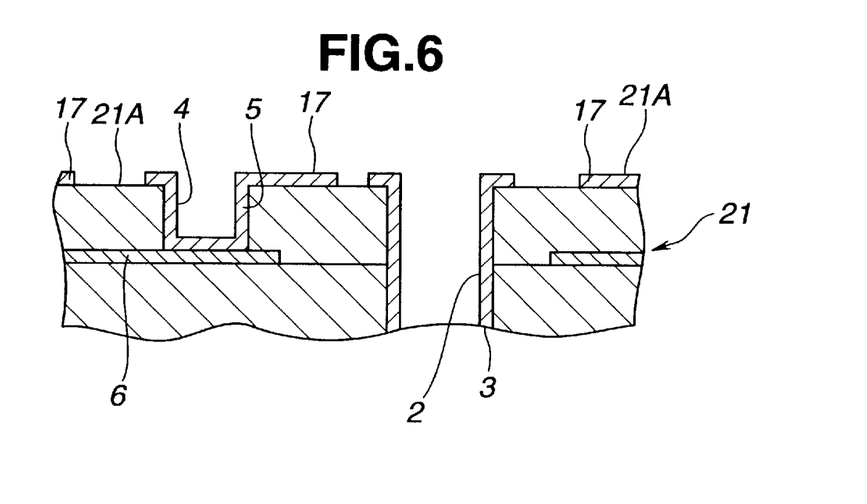
FIG. 6 is a view similar to FIG. 1B but shows a base of a printed circuit board, prior to a filling step, which step constitutes part of a method making a printed board according to a second embodiment of the present invention.
Figure 7:
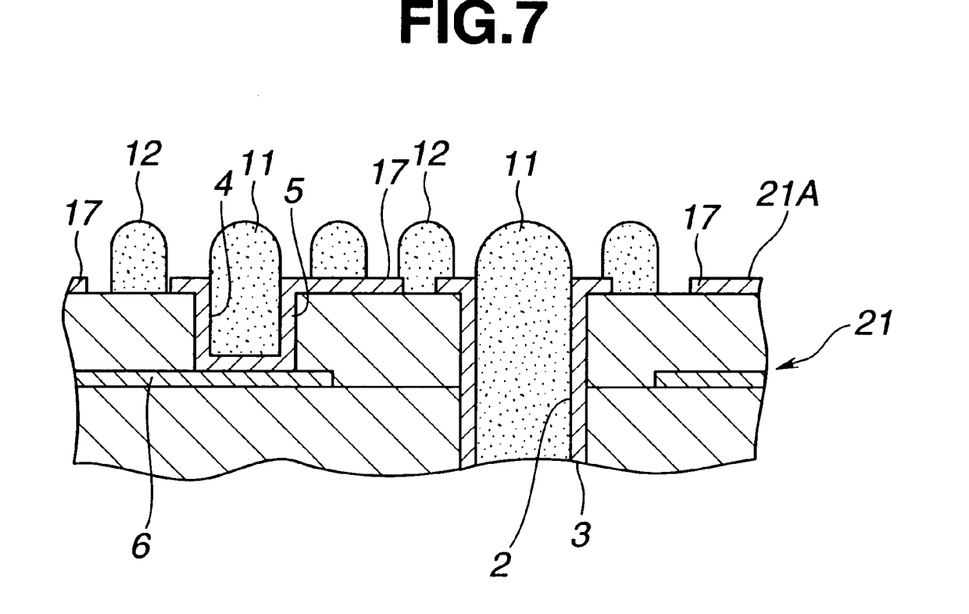
FIG. 7 is a view similar to FIG. 6 but shows the base after a filling step according to the second embodiment.
Figure 8:
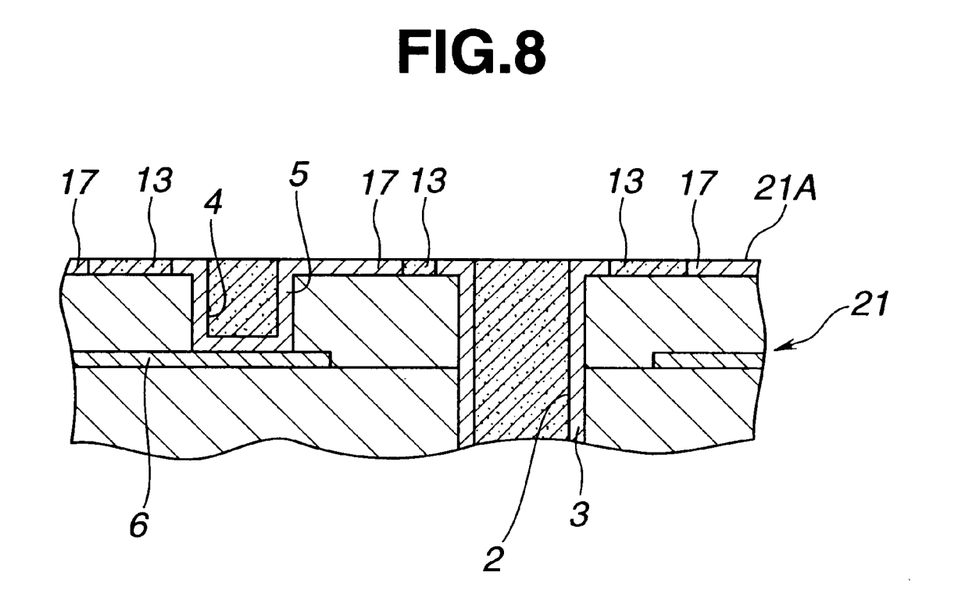
FIG. 8 is a view similar to FIG. 7 but shows the base after a grinding step.

Referring to FIGS. 6 to 8, the second embodiment will be described. This embodiment is substantially similar to the first embodiment described with reference to FIGS. 1A–1B to 5 except for a metallic layer 17 extending on a surface 21A of a base 21. Thus, similar portions to those of the first embodiment are designated by similar reference numerals and description thereto is omitted or made briefly.

The base 21 in this embodiment, as will be seen from FIG. 6, is previously formed with a conductive layer 17 of a predetermined pattern extending over the surface 21A of the base 21. Due to this, the surface 21A of the base 21 becomes rough or uneven depending upon whether the conductive layer 17 is present or not. The conductive layer 17 is obtained by, for example, processing the metallic layer 7 in the first embodiment, which extends over the entire surface 1A of the base 1, by etching and thereby forming it into a predetermined pattern.

The base 21 is processed by the filling step and the curing step similarly to the first embodiment. At the filling step, as shown in FIG. 7, resin paste is filled in the through holes 2 and the depressions 4 in such a manner that the resin paste fillings 11 partially protrude from the surface 21A, while at the same time a plurality of wartlike resin paste projections 12 are formed on the surface 21A. Further, similarly to the first embodiment, the through holes 2, the depressions 4 and the warlike resin paste projections 12 are arranged so as to allow the through holes 2, the depressions 4 and the resin paste projections 12 are located closely to each other.

Though the base 21 after the curing step is not shown, the surfaces of the cured resin fillings in the through holes 2 and the depressions 4 are held protruded from the surface 21A, i.e., held higher in level than the surface 21A. Thus, additional application of resin paste for closing receding spaces as in the prior art method can be dispensed with.

After the resin curing step, as shown in FIG. 8, the surface 21A of the base 21 is processed in such a manner that a layer (not shown) of cured resin 13 lying on the surface 21A is ground off to cause the conductive layer 17 to be exposed. Thereafter, similarly to the first embodiment, through not shown, an insulating layer is placed on the base 21 and a conductive layer is further formed on the insulating layer, whereby to complete a printed board.

In the first embodiment, the surface 1A of the base 1 becomes irregular by the amount corresponding to the thickness of the conductive layer. However, in this embodiment, the wartlike resin paste projections 12 are so arranged as to fill, at the curing step, recessed surface 21A portions where the conductive layers 17 are not provided, so that after grinding the cured resin 13 remains in the spaces between the conducive layers 17 to allow the surface 21A of the base 21 to be flat or planar as shown in FIG. 8. Due to this, an insulating layer formed on the surface 21A of the base 21 can be made flat assuredly.

While the present invention has been described and shown as above, it is not for the purpose of limitation but modifications and variations of the embodiments described above will occur to those skilled in the art, in light of the above teachings. For example, while in the above described embodiments the base 1 or 21 has been described and shown as consisting of a plurality of layers including an insulating layer and a conductive layer, it can be a core substrate of a single layer.

Further, while in the above described embodiments the base 1 or 21 has been described and shown as having a plurality of through via conductors 3 having through holes 2 and a plurality of blind via conductors 3 having depressions 4, it can have either of the through via conductors 3 with the through holes 2 or the blind via conductors 3 with the depressions 4.

Further, in case such blind via conductors 3 with depressions 4 are provided to the lower surface of the base 1 or 21, filling with resin paste in the above described manner can be applied to the lower surface of the base 1 or 21.

Figure 3C:
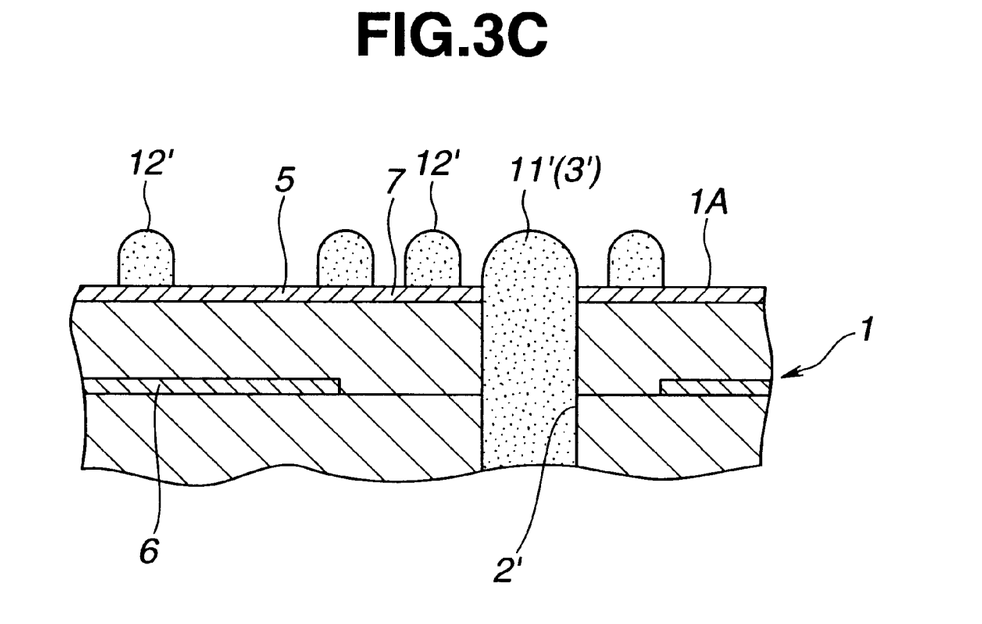
FIG. 3C is a view similar to FIG. 3B but shows a variant of the base of FIG. 1A.

Further, as shown in FIG. 3C, the base 1 is not always necessitated to include either of the through via conductors 3 or the blind via conductors 5 but it can be of the kind including through holes 2' which are not provided with plated layers on the inner peripheral surfaces thereof. At the filling step, the through holes 2' are filled with conductive resin paste while at the same time a plurality of projections 12' of conductive resin paste are formed on the surface 1A of the base 1 in the similar manner to the first embodiment. At the curing step, the conductive resin paste fillings 11 are formed into via conductors 3'. Thenceforth, the base 1 is processed similarly to the first embodiment to complete a printed board.

What is claimed is:

1. A method of making a printed board having a base having hollow portions closed by resin fillings, the method comprising the steps of:

preparing said base having said hollow portions;

filling said hollow portions of said base with resin paste by printing, while at the same time forming, on an upper surface of said base and at locations around said hollow portions, a plurality of projections made of said resin paste by printing; and curing said resin paste, thereby forming said resin fillings.

2. The method according to claim 1, wherein said projections are arranged in such a manner that there exists, within the distance of 1 mm or less from one of said hollow portions, at least one of the remainder of said hollow portions and said projections.

3. The method according to claim 1, wherein a larger number of said projections are arranged in a region of said upper surface of said base where the distance between adjacent two of said hollow portions is larger.

4. The method according to claim 1, wherein said projections are nearly circular in cross section and range in diameter from 100 to 500 $\mu$m.

5. The method according to claim 1, wherein said projections are nearly circular in cross section and range in diameter from 100 to 300 $\mu$m.

6. The method according to claim 1, wherein the distance between adjacent two of said projections is 0.7 mm or less.

7. The method according to claim 1, wherein said curing comprises allowing said projections of resin paste and resin paste fillings in said hollow portions to melt and spread over said upper surface of said base and form a layer of resin lying over said hollow portions.

8. The method according to claim 7, further comprising removing said layer of resin by grinding, thereby making upper surfaces of cured resin fillings in said hollow portions flush with said upper surface of said base.

9. The method according to claim 1, wherein said base has a lower surface opposite to said upper surface and a plurality of through via conductors having through holes which constitute said hollow portions and extend completely between said upper and lower surfaces of said base.

10. The method according to claim 1, wherein said base has a plurality of blind via conductors having depressions which constitute said hollow portions.

11. The method according to claim 1, wherein said base has a lower surface opposite to said upper surface, a plurality of through via conductors having through holes which constitute said hollow portions and extend completely between said upper and lower surfaces of said base and a plurality of blind via conductors having depressions which constitute said hollow portions.

12. The method according to claim 1, wherein said resin paste is conductive and said resin fillings constitute via conductors.

13. A method of making a printed board having a base provided with a plurality of via conductors having hollow portions closed by resin fillings, the method comprising the steps of:

preparing said base provided with said via conductors having said hollow portions;

filling said hollow portions of said via conductors with resin paste by printing, while at the same time forming, on an upper surface of said base and at locations around said hollow portions of said via conductors, a plurality of projections made of said resin paste by printing; and curing said resin paste, thereby forming said resin fillings.

14. The method according to claim 13, wherein said projections are arranged in such a manner that there exists, within the distance of 1 mm or less from one of said hollow portions, at least one of the remainder of said hollow portions and said projections.

15. The method according to claim 13, wherein a larger number of said projections are arranged in a region of said upper surface of said base where the distance between adjacent two of said hollow portions of via conductors is larger.

16. The method according to claim 13, wherein said projections are nearly circular in cross section and range in diameter from 100 to 500 $\mu$m.

17. The method according to claim 13, wherein said projections are nearly circular in cross section and range in diameter from 100 to 300 $\mu$m.

18. The method according to claim 13, wherein the distance between adjacent two of said projections is 0.7 mm or less.

19. The method according to claim 13, wherein said curing comprises allowing said projections of resin paste and resin paste fillings in said hollow portions to melt and spread over said upper surface of said base and form a layer of resin lying over said hollow portions of said via conductors.

20. The method according to claim 19, further comprising removing said layer of resin by grinding, thereby making upper surfaces of cured resin fillings in said hollow portions of said via conductors flush with said upper surface of said base.

21. The method according to claim 13, wherein said base has a lower surface opposite to said upper surface, sand said via conductors comprise through via conductors having through holes constituting said hollow portions and extending completely between said upper and lower surfaces of said base.

22. The method according to claim 13, wherein said via conductors comprise blind via conductors having depressions constituting said hollow portions.

23. The method according to claim 13, wherein said base has a lower surface opposite to said upper surface, and said via conductors comprise through via conductors having through holes constituting said hollow portions and extending completely between said upper and lower surfaces of said base and blind via conductors having depressions constituting said hollow portions.

* * * * *